United States Patent [19]

Rooijmans et al.

[11] 3,938,111
[45] Feb. 10, 1976

[54] MAGNETIC DEVICE FOR PRODUCING DOMAINS

[75] Inventors: Coenraad Jozef Maria Rooijmans; Willem Frederik Druyvesteyn; Jan Willem Frederik Dorleijn, all of Eindhoven, Netherlands

[73] Assignee: U.S. Philips Corporation, New York, N.Y.

[22] Filed: Mar. 13, 1974

[21] Appl. No.: 450,760

[30] Foreign Application Priority Data
Mar. 13, 1973 Netherlands .................... 733464

[52] U.S. Cl. .......................................... 340/174 TF
[51] Int. Cl.² ......................................... G11C 11/14
[58] Field of Search ............... 340/174 TF, 174 SR

[56] References Cited
UNITED STATES PATENTS
3,662,359  5/1972  Genovese .................... 340/174 TF
3,824,565  7/1974  Archer et al. ................ 340/174 TF

*Primary Examiner*—Stanley M. Urynowicz, Jr.
*Attorney, Agent, or Firm*—Frank R. Trifari; Carl P. Steinhauser

[57] ABSTRACT

Magnetic device comprising at least one thin layer of a magnetisable material which has a preferred direction of magnetisation substantially at right angles to the surface of the layer. Magnetic domains are produced by a magnetic field which is situated substantially in the plane of the layer and does not change direction and enables similar domains to be produced. The domains are there after maintained by a field normal to the layer. A domain guide structure may also be provided on the layer to move the domains.

3 Claims, 1 Drawing Figure

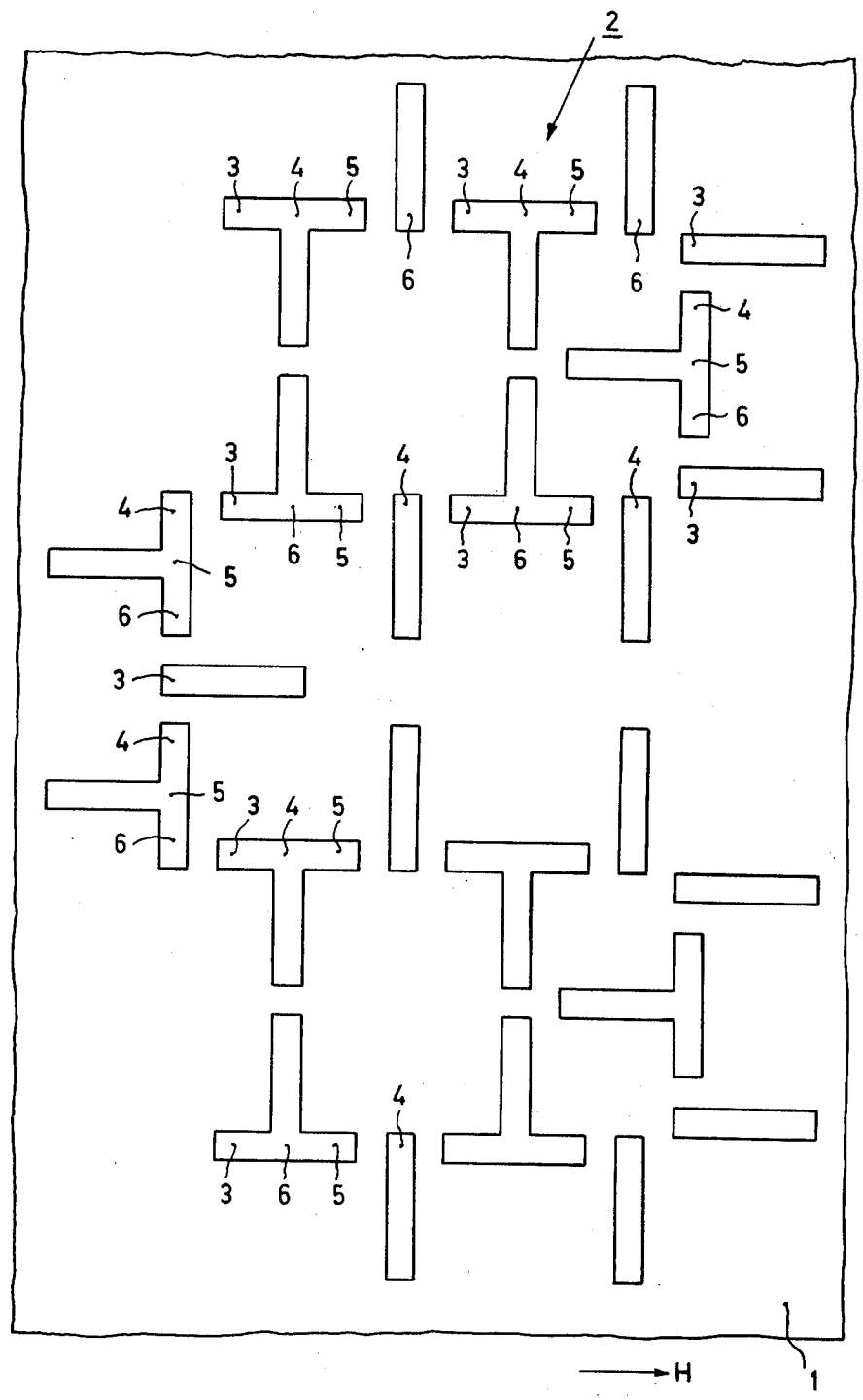

MAGNETIC DEVICE FOR PRODUCING DOMAINS

The invention relates to a magnetic device comprising at least one thin layer of a magnetisable material having a preferred direction of magnetisation which is substantially at right angles to the surface of the layer, and further comprising means for producing, maintaining and possibly annihilating magnetic domains in this layer.

The rare-earth and yttrium orthoferrites and some ferrites having garnet structure are examples of materials suitable for this purpose. The materials have a preferred direction of magnetisation owing to their uniaxial anisotropy. This uniaxial anisotropy may be characterized by what is generally referred to as a uniaxial anisotropy field. As a means of maintaining and possibly annihilating the magnetic domains in platelets of the said materials an external magnetic field $H_o$ is used the direction of which concides at least substantially with the said preferred direction of magnetisation of the platelet. The magnetic domains may, for example, be circular-cylindrical and can only exist in a stable form in the case of magnetic fields $H_o$ the strength of which lies between given limits. These limiting values of the field depend inter alia upon the thickness of the platelet in which the domains occur and upon its chemical composition. The domains may alternatively be annular or strip-shaped.

The transition from the direction of magnetisation within a domain to the opposite direction outside the domain is formed by a wall. Now a wall may have different kinds and as a result the domains may have different properties. For example, the limits of the magnetic field $H_o$ within which the domains exist in a stable form are different. Furthermore the differences show themselves especially during movement of the domains. A description of the various types of walls is given in "The Bell System Technical Journal," volume 51, No. 6 (July-Aug. 1972), pages 1,427–1,431. In a given case the entire wall is a so-called Bloch wall. In another case the wall comprises a large number of Blochwall segments and also a large number of Néel-wall segments. In the first case the domain is called a normal domain and in the second case it is called a hard domain; domains having a wall between these two extremes are called intermediate domains.

Because domains having walls of different kinds behave differently during movement of the domains, a magnetic device which includes domains having walls of different kinds provides great difficulty in operation. The known means for producing magnetic domains in a thin layer of a magnetisable material are incapable of producing domains having walls of a given kind only. A paper in The Bell System Technical Journal, Volume 51, No. 6 (July-Aug. 1972), pages 1,440–1,444 describes the provision of a second magnetic layer as a means to suppress hard domains. Such a construction renders manufacture of the magnetic device complicated.

According to the present invention means are provided by which domains are produced which behave as normal domains in practice. This is shown by the fact that they are stable for values of the field $H_o$ between the limits which apply to a normal domain. They contain at most two Bloch-wall segments.

According to the invention, the means for producing the domains consist of means for producing and modifying a magnetic field which is situated substantially in the plane of the layer and does not change direction. If a magnetic field exceeding the uniaxial anisotropy field of the material is applied in the plane of the layer, the layer is homogeneously magnetised. In this case magnetisation lies substantially in the plane of the layer. If now the value of the magnetic field in the plane of the layer is reduced to zero, magnetic domains are produced. These domains are stable for values of the field $H_o$ between the limits which apply to a normal domain, so that they behave as normal domains in practice. Each of these domains may be used to produce a large number of further domains which will all behave as normal domains.

The value of the magnetic field in the plane of the layer required to produce domains depends upon the value of the uniaxial anisotropy field; it is about equal to this field. To permit the use of simply obtainable magnetic fields the value of the uniaxial anisotropy field $H_k$ of the magnetisable material preferably is less than 1,000 oersted.

In particular a domain guide structure is provided on the layer. Thus part of the domains are produced on the domain guide structure so that they can simply be moved.

An emobdiment of the invention will now be described, by way of example, with reference to the accompanying diagrammatic drawing the single FIGURE of which shows a magnetic device having a given domain guide structure.

Referring now to the FIGURE, part of a platelet 1 of a magnetisable material carries a T-bar structure 2 of permalloy having poles 3, 4, 5 and 6. A field $H_o$ normal to the platelet 1 is applied to maintain the domains to be produced. To produce the domains a magnetic field H is applied in the direction indicated by the arrow at the bottom of the FIGURE, so that the platelet is homogeneously magnetised in this direction. The value of this magnetic field then is reduced to zero. As a result many magnetic domains are produced in the platelet. In the area where the domain guide structure is provided a magnetic domain is produced at each pole 3 or at each pole 5, depending upon the direction of the field $H_o$. The said domains are maintained by the field $H_o$. It has been found that all these domains are stable at values of the magnetic field $H_o$ between the same limits, which prove to be the limits which hold for a normal domain. By means of a magnetic field which rotates in the plane of the platelet 1 the domains are movable according to the structure 2 along the poles 4, 5, 6, 3, 4, 5, . . . . Thus the domains produced in the device can be moved to a magnetic device in which they are utilised. In a given case the platelet consists of $Y_{2.6}$ $Gd_{0.3}$ $Pb_{0.1}$ $Fe_{3.8}$ $Ga_{1.2}$ $O_{12}$ and is 6 μm thick. It has a uniaxial anisotropy field of 915 oersted and its saturation magnetisation is 24 gauss. The field $H_o$ is 212 oersted and the field H is 915 oersted. In another case the platelet is made of $Y_{2.68}$ $Gd_{0.32}$ $Fe_{4.08}$ $Ga_{0.92}O_{12}$ and is 8 μm thick. It has a uniaxial anisotropy field of 183 oersted and its saturation magnetisation is 22.2 gauss. The field $H_o$ is 200 oersted and the field H is 180 oersted.

What is claimed is:

1. A magnetic device comprising at least one thin layer of a magnetizable material having a preferred direction of magnetization with a uniaxial anisotropy field $H_K$ substantially at right angles to the surface of the layer, means to produce a magnetic field having a strength exceeding the uniaxial anisotropy field in the plane of the layer which does not change direction whereby the layer is homogeneously magnetized, and means to reduce the magnetic field in the plane of the layer to zero whereby magnetic domains are produced in the layer.

2. Magnetic device as claimed in claim 1, wherein the value of the uniaxial anisotropy field $H_k$ of the magnetisable material is less than 1,000 oersted.

3. Magnetic device as claimed in claim 1 wherein a domain guide structure is provided on the layer.

* * * * *

UNITED STATES PATENT AND TRADEMARK OFFICE
CERTIFICATE OF CORRECTION

PATENT NO. : 3,938,111
DATED : February 10, 1976
INVENTOR(S) : COENRAAD J.M. ROOIJMANS ET AL It is certified that error appears in the above-identified patent and that said Letters Patent are hereby corrected as shown below:

On the Title Page section [30] change "733464" to --7303464--

Signed and Sealed this

*twenty-second* Day of *June 1976*

[SEAL]

Attest:

RUTH C. MASON
*Attesting Officer*

C. MARSHALL DANN
*Commissioner of Patents and Trademarks*